United States Patent [19]

Wang

[11] Patent Number: 4,581,576
[45] Date of Patent: Apr. 8, 1986

[54] NONDESTRUCTIVE METHOD FOR PROFILING IMPERFECTION LEVELS IN HIGH RESISTIVITY SEMICONDUCTOR WAFERS

[75] Inventor: Faa-Ching Wang, Rohnert Park, Calif.

[73] Assignee: Hewlett-Packard Company, Palo Alto, Calif.

[21] Appl. No.: 602,831

[22] Filed: Apr. 23, 1984

[51] Int. Cl.[4] .................. G01R 31/26; G01R 1/04; H01L 7/00
[52] U.S. Cl. .......................... 324/65 P; 324/52; 324/158 D; 29/574
[58] Field of Search ............... 29/574; 357/29, 30; 324/62, 65 R, 65 P, 52, 158 D, 158 T

[56] References Cited

U.S. PATENT DOCUMENTS

| | | | |
|---|---|---|---|
| 4,287,473 | 9/1981 | Sawyer | 324/158 D |
| 4,301,409 | 11/1981 | Miller | 324/158 D |
| 4,442,402 | 4/1984 | Besomi | 324/158 D |
| 4,456,879 | 6/1984 | Kleinknecht | 324/158 D |
| 4,473,795 | 9/1984 | Wood | 29/574 |

OTHER PUBLICATIONS

Blunt et al.; "Dislocation Density and Sheet Resistance Variations . . . " IEEE Trans. on Electron Devices–Jul. 1982, pp. 1039–1044.

Primary Examiner—Reinhard J. Eisenzopf
Assistant Examiner—Jose M. Solis
Attorney, Agent, or Firm—Patrick J. Barrett

[57] ABSTRACT

A method is disclosed for nondestructively profiling the uniformity of imperfection level densities in a semiconductor wafer. Resistance profiles from the wafer are obtained using an opaque spot filter and an optical filter. The difference between the resistance profiles is proportional to the density fluctuations of imperfections in the wafer material. By comparing the resistance profiles obtained using the opaque spot filter, and the optical filter an optically assisted imperfection profile (OAIP) of the imperfections in the wafer material is obtained.

6 Claims, 6 Drawing Figures

NONDESTRUCTIVE METHOD FOR PROFILING IMPERFECTION LEVELS IN HIGH RESISTIVITY SEMICONDUCTOR WAFERS

BACKGROUND

This invention relates to a method for nondestructively characterizing the uniformity of imperfection levels in high resistivity semiconductor wafers which are for use in the fabrication of integrated circuits or optoelectronic devices.

Profiling techniques capable of detecting dominant imperfection distributions or levels in semiconductor materials are particularly important because these imperfections often influence device performance. Dominant imperfection distributions or levels for high resistivity semiconductors are characterized as deep donors or acceptors which compensate for free electrons or free holes in the semiconductor wafers resulting in charge neutrality. Most of the currently used techniques do not produce data suitable for directly comparing wafer quality and device performance because of their destructive nature or requirements for low temperatures during data measurements.

Commonly used profiling techniques include Hall effect measurements, Deep Level Transient Spectroscopy (DLTS), Photoluminescence (PL), and Fourier Transform Infrared Absorption (FTIR). Drawbacks of using Hall effect measurements and DLTS methods for profiling lie in the fact that they are not only destructive but also require time consuming sample preparation and data acquisition. While PL can be used for nondestructive profiling, measurements must be carried out at very low temperatures. In addition, only imperfections with luminescence behavior can be detected. FTIR has also been used for detecting various imperfections; however, FTIR requires a thicker layer of wafer material in order to have significant infared absorption. Therefore, device processing is not possible immediately following FTIR measurements.

An electrical profiling technique described by R. T. Blunt, S. Clark, and D. J. Stirland in an article entitled "Dislocation Density and Sheet Resistance Variations Across Semi-Insulating GaAs Wafers" published in the IEEE Transactions on Electron Devices, Vol. ED-29, No. 7, July 1982 has been used to measure sheet resistances across wafers cut from Liquid Encapsulated Czochralski (LEC) pulled semi-insulating GaAs boules. The technique involves the use of a "dark spot" for electrical uniformity mapping. A uniformly illuminated strip of GaAs having a contact at each end is fitted with a moveable mask; the moveable mask prevents the light from reaching a small portion of the GaAs (i.e., creating a dark spot on the GaAs). The resistance is measured across the dark spot under the moveable mask. An electrical profile of the GaAs strip is obtained by moving the mask along the illuminated strip. The method is extended to cover complete wafers by using a fixed mask to prevent light from reaching the material on either side of the uniform width strip to be measured. The concept is also extended to cover sheet resistance mapping over the complete area of a circular wafer by sequentially illuminating and scanning strips between opposite pairs of contacts.

SUMMARY OF THE INVENTION

The preferred embodiment of the present invention uses an Optically-Assisted Imperfection Profile (OAIP) method to profile the imperfection uniformity of high resistivity semiconductor wafers which are used in the fabrication of integrated circuits or optoelectronic devices. The method is nondestructive and therefore allows device processing immediately after profiling. An opaque mask having a transparent strip is positioned over a wafer. An opaque spot is then positioned over a portion of the transparent region. The opaque spot produces a dark spot on the wafer. A light source is located over the opaque mask for illumination. A variable voltage source is connected to the wafer via metal contacts. The variable voltage source coupled with a resistor is set to supply a constant current, and the resistance across the contact points is measured using an electrometer. The measured direct current (dc) voltage for a given applied dc current is equivalent to the resistance across the dark spot. The measured dark spot resistance represents the effect of all intrinsic and extrinsic material properties present in the dark spot. By moving the opaque spot along the transparent region over the wafer, a resistance profile is determined. The opaque spot is replaced by an optical filter to determine relative fluctuations in the density of a specific imperfection on the wafer conductivity. The optical filter transmits a wavelength corresponding to the excitation energy of a specific imperfection under illumination. The uniformity profile of the imperfection level density is determined experimentally by comparing the two resistance profiles obtained using the opaque spot and the optical filter.

DETAILED DESCRIPTION OF THE INVENTION

Figure 1A:
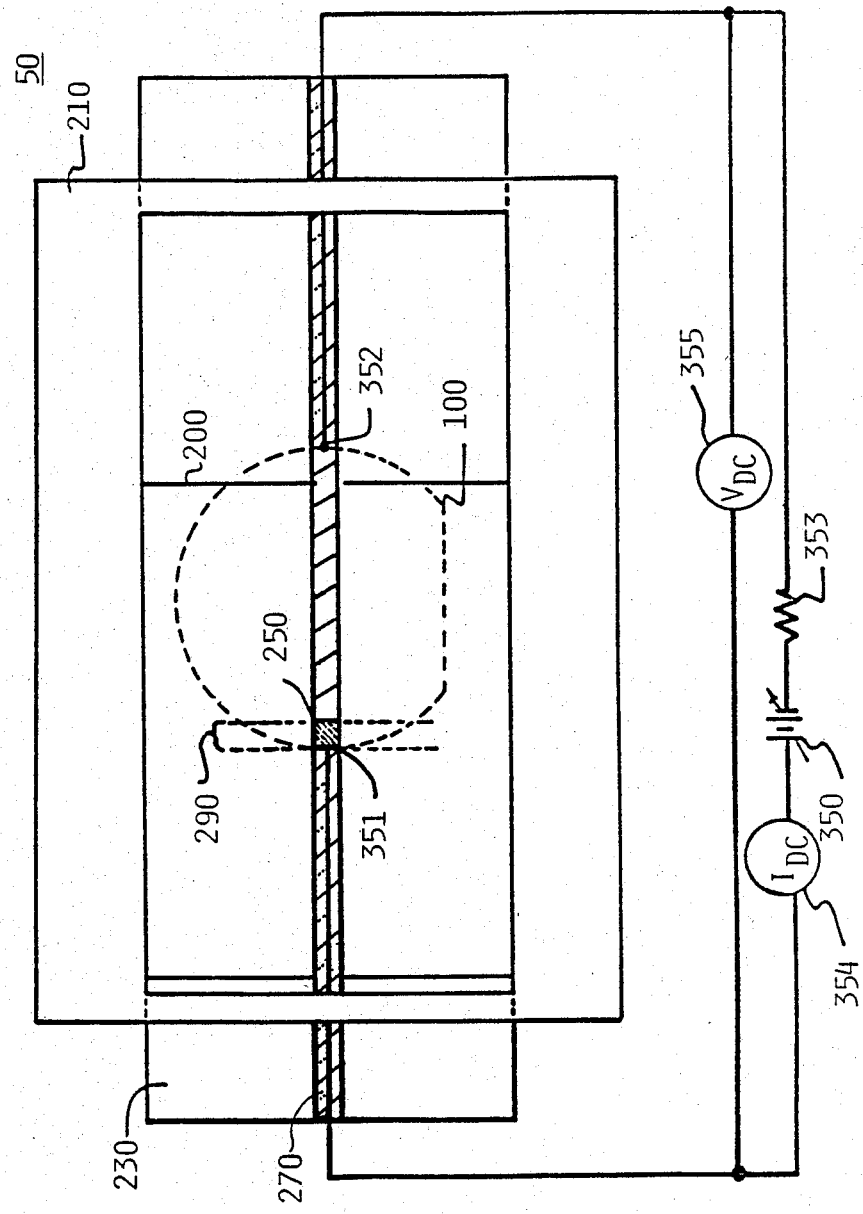
FIG. 1A shows a mask assembly of the preferred embodiment according to the present invention.
Figure 1B:
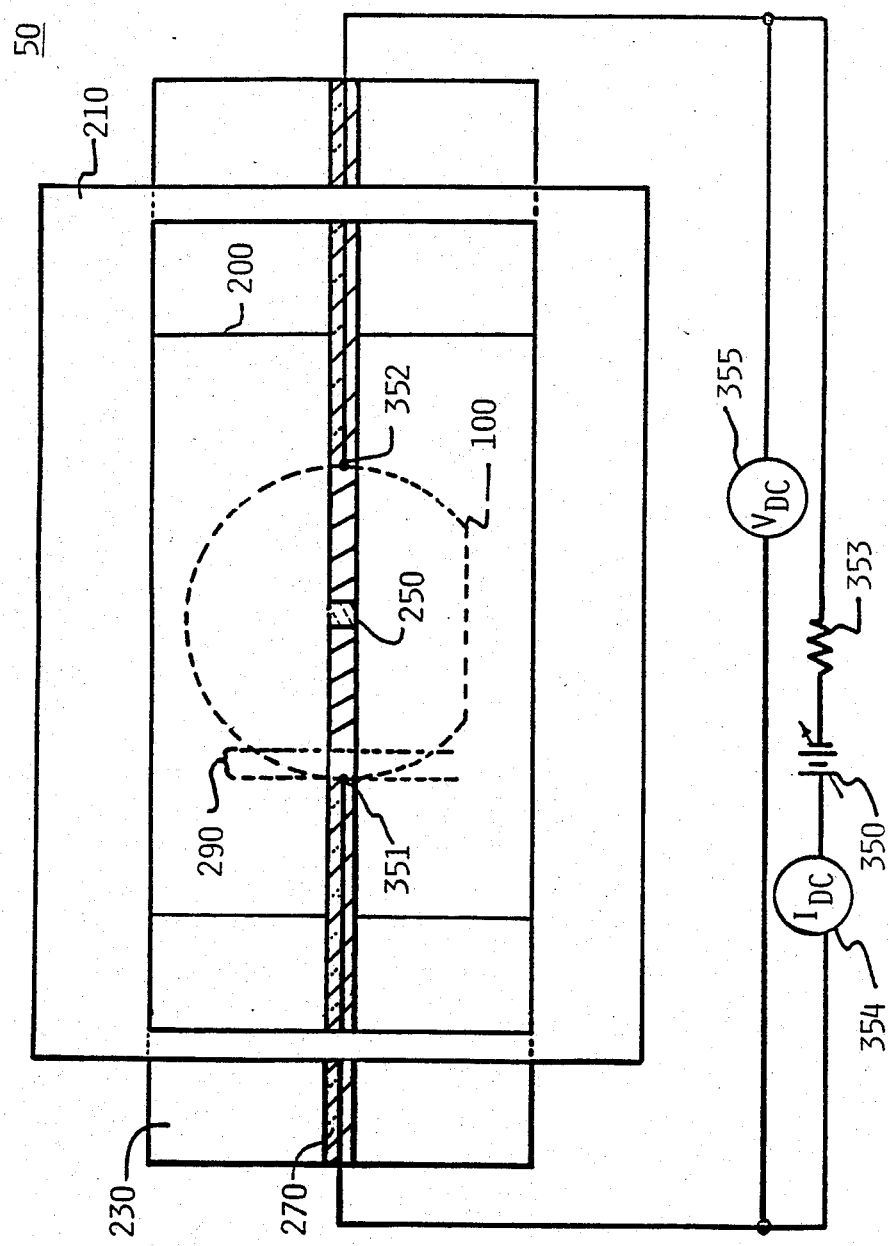
FIG. 1B shows the mask assembly illustrated in FIG. 1A after movement.

FIG. 1A shows a mask assembly 50 according to the preferred embodiment of the present invention. The OAIP method utilizes the photoconductivity effect, which is the change of the wafer material conductivity due to illumination. The change of the conductivity primarily comes from the increase of photogenerated carriers. Typical values of photo-generated carriers are in the range of $10^{12}$ to $10^{14}$ under illumination by a laboratory microscope lamp having a 40 watt bulb placed approximately 6 inches from a wafer surface. These values compare the values of free carrier concentration of $10^8$ cm$^{-3}$ or less for high resistivity materials such as undoped GaAs and Fe doped InP with that of $10^{16}$ to $10^{18}$ cm$^{-3}$ for specifically doped low resistivity materials without illumination. Therefore, photoconductivity is more significant for high resistivity materials than for low resistivity materials at the same illumination intensity. As shown in FIG. 1A, a moveable opaque spot support 200 guided by a frame 210 and having an opaque spot 250 located over a portion of a transparent region 270 in an opaque mask 230 is positioned over a high resistivity wafer 100, typically made of GaAs. Other materials such as ZnSe, CdS, and InP can be used for wafer 100. Opague spot 250 is initially positioned over area 290 on wafer 100 to obtain a control voltage reading across the dark spot of the substrate 100 under the opaque spot 250. FIG. 1B shows the mask assembly illustrated in FIG. 1A after the control voltage measurement across the dark spot has been taken. The dark spot is moved across transparent region 270 for subsequent voltage measurements.

Figure 4:
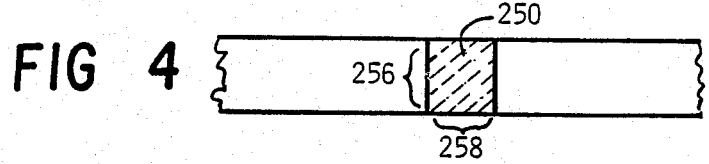
FIG. 4 shows an enlarged view of a portion of mask assembly illustrated in FIG. 2.

Typically, transparent region 270 is made of a thin inorganic material known under the trademark of "Mylar" and measures 0.2 cm in width and 16 cm in length. Opaque spot 250 is typically 0.2 cm in length and width and the wafer thickness is typically 0.4 mm. The dimensions of the opaque spot 250 are typically chosen to be several times larger than the wafer thickness in order to minimize the electric field fringe effect (see a text by W. R. Runyan, entitled "Semiconductor Measures in Instrumentation" published by Mcgraw-Hill, 1975, chapter 3). Also, the length 256 and width 258 of the opaque spot 250, shown in FIG. 4, should be longer than the diffusion length of photogenerated carriers in the given wafer material.

Figure 2:
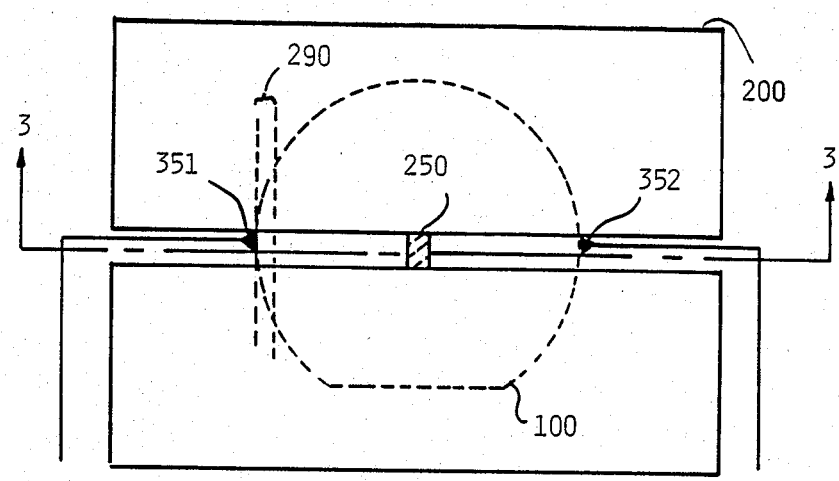
FIG. 2 shows a portion of the mask assembly illustrated in FIG. 1B.
Figure 3:
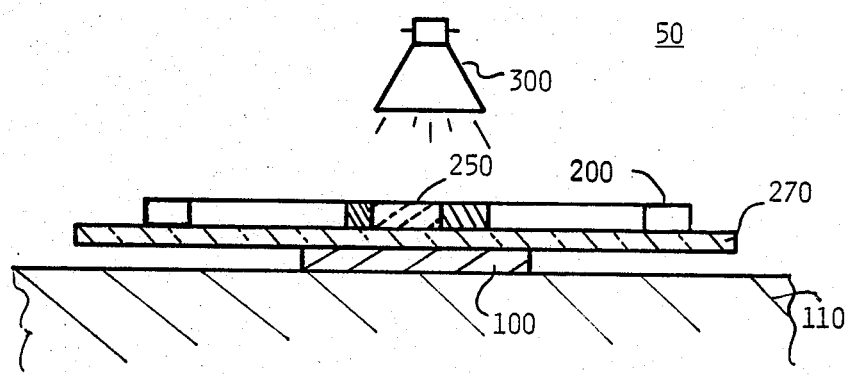
FIG. 3 shows a cross-section view of a portion of the mask assembly illustrated in FIG. 2.

FIG. 2 shows an enlarged center portion of the mask assembly illustrated in FIG. 1B. FIG. 3 illustrates a cross-section view through FIG. 2. As shown in FIG. 3, light from light source 300 is projected through transparent region 270 to illuminate uniformly wafer 100 on a wafer carrier 110. Since the photoconductivity for the high resistivity wafers is orders of magnitude larger than the dark conductivity at a given light level, e.g., illumination under a 40 watt bulb placed approximately 6 inches from a wafer surface, the resistance across transparent region 270 on either side of opaque spot 250 is negligible compared with the resistance across the opaque spot region 250.

As shown in FIG. 1A, a variable voltage source 350 is connected to wafer 100 at locations 351 and 352 by conventional methods, for example ultrasonic soldering using indium metal for GaAs. The variable voltage source 350 coupled with a resistor 353 is set to supply a constant current, and the voltage across locations 351 and 352 is measured using a electrometer 355 while the current is measured with an ammeter 354. Voltage measurements are taken at room temperature and over a total time period of 30 minutes or less to move the opaque spot across the region 270 over wafer 100.

The opaque mask 230 is fixed and placed in direct contact with wafer 100. The opaque spot support 200 and opaque spot 250 are moved laterally across transparent region 270. The measured dc voltage for a given applied dc current is essentially equivalent to the resistance across the dark spot on wafer 100. The measured dark spot resistance represents the net effect of all intrinsic and extrinsic material properties, such as point lattice defects and impurity defects, present in the dark spot. An initial resistance profile of the wafer 100 is obtained by laterally moving the opaque spot 250 along transparent region 270 at 3 mm increments.

Figure 5:
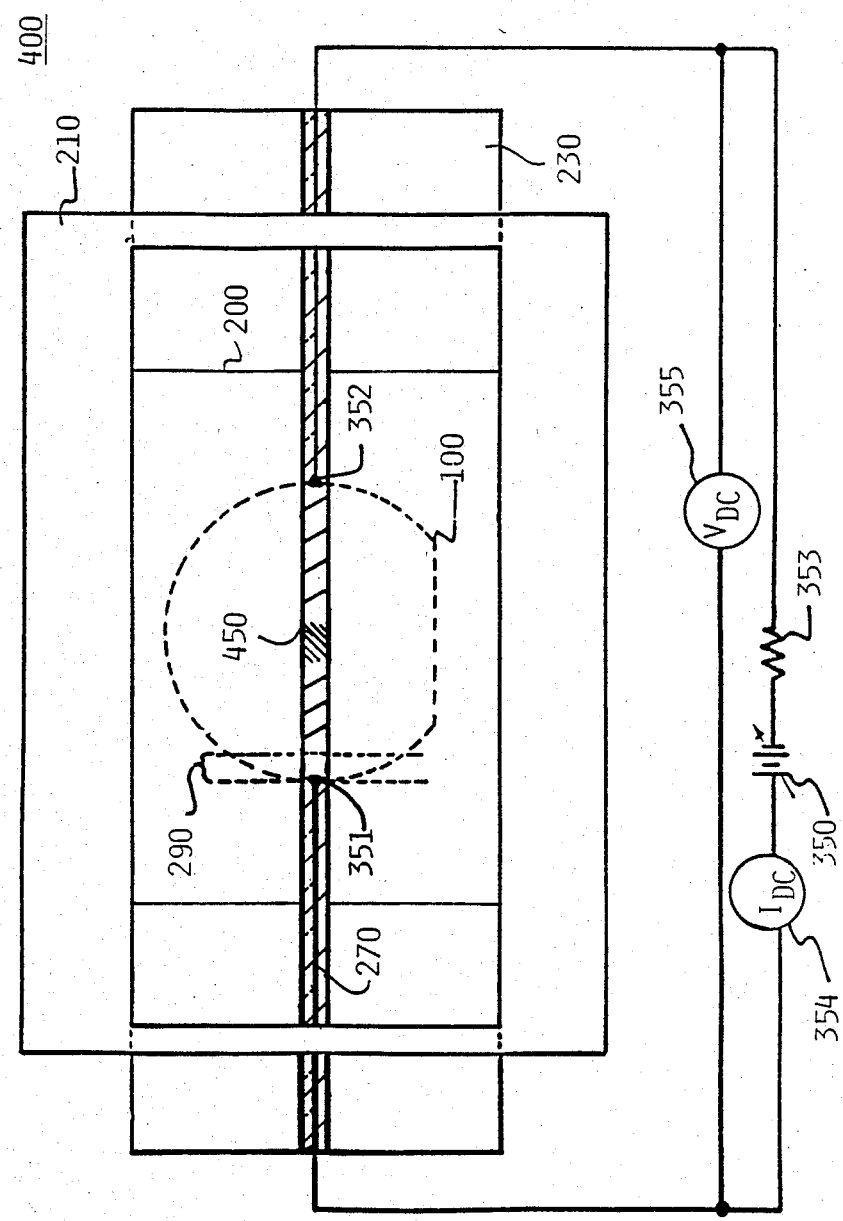
FIG. 5 shows a mask assembly for use with the preferred embodiment illustrated in FIG. 1A.

FIG. 5 shows a mask assembly 400 for use in determining the relative fluctuation in density of a specific imperfection on the wafer material using the above described method. The mask assembly is positioned over the same GaAs wafer 100 used in the initial resistance profile illustrated in FIG. 1A. The opaque spot support 200 and particularly an optical filter 450 are coaxially aligned over the same initial measurement region 290 over wafer 100. The optical filter 450 only allows energy at a selected wavelength to reach wafer 100. Commercially available optical filters with a central wavelength of the band width in the range of 0.4 to 15 microns may be used as filters 450. The optical filter of the preferred embodiment has a band width typically in the range of 0.02 to 0.45 microns.

Light source 300 is again positioned over support 200 and light from this source is projected through transparent region 270 to illuminate wafer 100. The resistance of the area on the wafer under the optical filter is determined in a manner similiar to that of FIG. 1A. A resistance profile using the optical filter 450 of wafer 100 is obtained by moving the optical filter 450 across transparent region 270 in a manner similar to that of opaque spot 250 as illustrated in FIG. 1A. The difference between the resistance measured for a given region of wafer 100 using opaque spot 250 and optical filter 450 is proportional to the density of the specific imperfection excited by the wavelength of light illuminating wafer 100 through optical filter 450. The uniformity profile of the imperfection level density of the high resistivity wafer 100, therefore, is determined experimentally by comparing the two resistance profiles obtained using the opaque spot 250 and the optical filter 450.

While the OAIP procedure can be performed manually, it can also be performed automatically. In addition, the OAIP method can be applied to any imperfection in a material, provided that a suitable light source and filter are used and the imperfection density is large enough for the measurement sensitivity.

I claim:

1. An apparatus for measuring characteristics of a semiconductor wafer, the apparatus comprising:
   a wafer carrier for supporting a semiconductor wafer;
   a light source located over the wafer carrier in a plane substantially parallel to the wafer carrier;
   an opaque mask interposed between the wafer carrier and the light source in a plane substantially parallel to the wafer carrier, the opaque mask having a transparent region, the transparent region extending to the perimeter of a wafer;
   an opaque spot interposable between the light source and a portion of the transparent region in a plane substantially parallel to the transparent region;
   means for positioning the opaque spot over a selected portion of the transparent region in a plane substantially parallel to the transparent region and for removing the opaque spot therefrom;
   means for measuring a first resistance of a wafer on the wafer carrier under the opaque spot;
   means for positioning an optical filter over said selected portion of the transparent region in a plane substantially parallel to the transparent region; and
   means for measuring a second resistance of a wafer under the optical filter.

2. An apparatus as in claim 1 wherein the optical filter has a bandwidth in the range of 0.4 to 15 microns.

3. An apparatus for measuring characteristics of a semiconductor wafer, the apparatus comprising:
   a wafer carrier having a wafer therein;
   a light source located over the wafer in plane substantially parallel to the wafer;

an opaque mask interposed between the wafer and the light source in a plane substantially parallel to the wafer, the opaque masking having a transparent region, the transparent region extending to the perimeter of the wafer;

an opaque spot interposable between the light source and a portion of the transparent region in a plane substantially parallel to the transparent region;

means for positioning the opaque spot over a selected portion of the transparent region in a plane substantially parallel to the transparent region and for removing the opaque spot therefrom;

means for measuring a first resistance of the wafer under the opaque spot;

means for positioning an optical filter over said selected portion of the transparent region in a plane substantially parallel to the transparent region; and means for measuring a second resistance of the wafer under the optical filter.

4. An apparatus as in claim 3 wherein the optical filter has a band width in the range of 0.4 to 15 microns.

5. A method for measuring characteristics of a semiconductor wafer comprising the steps of:

positioning a wafer in a wafer carrier;

positioning a light source over the wafer in a plane substantially parallel to the wafer, the light source being for projecting light;

positioning an opaque mask over the wafer in a plane substantially parallel to the wafer, the opaque mask having a transparent region, the transparent region extending to the perimeter of the wafer;

positioning an opaque spot over a portion of the transparent region in a plane substantially parallel to the transparent region;

measuring a first resistivity of the wafer under the opaque spot;

removing the opaque spot;

positioning an optical filter over a portion of the transparent region in a plane substantially parallel to the transparent region; and measuring a second resistivity of the wafer under the optical filter.

6. A method as in claim 5 further comprising the step of:

calculating the difference between the first and second resistances measured in a same area of the wafer.

* * * * *